United States Patent [19]

Busch et al.

[11] Patent Number: 4,992,984

[45] Date of Patent: Feb. 12, 1991

[54] MEMORY MODULE UTILIZING PARTIALLY DEFECTIVE MEMORY CHIPS

[75] Inventors: Robert E. Busch, Colchester; Wayne F. Ellis, Jericho; Theodore M. Redman, Milton; Endre P. Thoma, Colchester, all of Vt.

[73] Assignee: International Business Machines Corporation, Armonk, N.Y.

[21] Appl. No.: 458,001

[22] Filed: Dec. 28, 1989

[51] Int. Cl.$^5$ .................................... G11C 7/00
[52] U.S. Cl. ........................... 365/200; 365/230.03; 365/230.06
[58] Field of Search ............ 365/200, 230.06, 230.03, 365/225.7; 371/10.2, 10.3

[56] References Cited

U.S. PATENT DOCUMENTS

| 3,714,637 | 1/1973 | Beausoleil | 365/200 |
| 3,735,368 | 5/1973 | Beausoleil | 365/200 |
| 3,781,826 | 12/1973 | Beausoleil | 365/200 |
| 4,837,747 | 6/1989 | Dosaka et al. | 365/200 X |

*Primary Examiner*—Joseph A. Popek
*Attorney, Agent, or Firm*—Sughrue, Mion, Zinn, Macpeak & Seas

[57] ABSTRACT

A memory device which includes several partially defective memory chips and a control circuit for receiving an address signal corresponding to a storage cell address of each of the partially defective memory chips, and for controlling, in response to the address signal, the partially defective memory chips such that only one thereof is enabled.

14 Claims, 4 Drawing Sheets

| Ax | FUSE CIRCUIT 10 OUTPUT | SWITCHES S1 AND S2 | OUTPUT OF CIRCUIT 1 |
|---|---|---|---|
| 0 | 1 | UP POSITION | HIGH/ENABLE |
| 1 | 1 | UP POSITION | LOW/DISABLE |
| 0 | 1 | DOWN POSITION | LOW/DISABLE |
| 1 | 1 | DOWN POSITION | HIGH/ENABLE |

| ADDRESS | CHIP C1 | CHIP C2 |
|---|---|---|
| 0 0 | GOOD | BAD |
| 0 1 | GOOD | BAD |
| 1 0 | BAD | GOOD |
| 1 1 | BAD | GOOD |

FIG.6A 1/4-GOOD MEMORY CHIP

| ADDRESS | 1/4-FUSE CKT | 3/4-FUSE CKT | SWITCHES S1-S2 | SWITCHES S3-S4 | OUTPUT CONTROL CKT |
|---|---|---|---|---|---|
| 0  0 | 1 | 0 | UP | UP | ENABLE |
| 0  1 | 1 | 0 | UP | UP | DISABLE |
| 1  0 | 1 | 0 | UP | UP | DISABLE |
| 1  1 | 1 | 0 | UP | UP | DISABLE |
| $A_x$  $A_y$ | | | | | |

FIG.6B 3/4-GOOD MEMORY CHIP

| ADDRESS | 1/4-FUSE CKT | 3/4-FUSE CKT | SWITCHES S1-S2 | SWITCHES S3-S4 | OUTPUT CONTROL CKT |
|---|---|---|---|---|---|
| 0  0 | 0 | 1 | DOWN | DOWN | DISABLE |
| 0  1 | 0 | 1 | DOWN | DOWN | ENABLE |
| 1  0 | 0 | 1 | DOWN | DOWN | ENABLE |
| 1  1 | 0 | 1 | DOWN | DOWN | ENABLE |
| $A_x$  $A_y$ | | | | | |

MEMORY MODULE UTILIZING PARTIALLY DEFECTIVE MEMORY CHIPS

FIELD OF THE INVENTION

The present invention relates to a computer memory constructed of partially defective memory chips (i.e., memory chips containing some defective storage cells).

BACKGROUND OF THE INVENTION

In monolithic memories, several storage cells are formed on a single silicon wafer, and then the wafer is cut into a number of smaller units called chips. These chips are arranged on substrates which are packaged in Integrated Circuit (IC) modules. The IC modules are soldered into printed circuit memory cards to form a basic component of a computer memory. During the production of monolithic chips, some of the storage cells may become defective. For example, some memory chips may incur localized imperfections which render a plurality of storage cells defective. Rather than reject an entire memory chip having some defective storage cells, it is known to utilize such a partially defective memory chip in a computer memory.

For example, U.S. Pat. No. 3,781,826 discloses a system in which partially defective memory chips are arranged on a memory array card, and logic circuitry is provided between a memory address register and the array card. The logic circuitry translates each address output from the register to prevent addressing of storage cells in defective areas of the memory chips. When an address corresponding to a storage cell in a defective area of a chip is output from the register, the logic circuitry transforms the address to that of a storage cell in a non-defective area of the chip. In this way, defective storage cells are not accessed. U.S. Pat. Nos. 3,735,368 and 3,714,637 are further examples of computer memory systems which utilize partially defective memory chips.

Although it is generally known to utilize partially defective memory chips in a computer memory system, such known systems have a shortcoming in that the partially defective memory chips are not pin-for-pin compatible with each other. More specifically, when several partially defective chips are implemented as a full-size memory chip (i.e., a memory chip having no defective storage cells) equivalent, each partially defective chip receives a separate chip select signal via a separate chip select pin, thereby preventing the simultaneous selection and output of partially defective chips. Since each partially defective memory chip contains a separate chip select pin, these memory chips are not pin-for-pin compatible with each other, and cannot be stacked to form a memory component which is the pin and functional equivalent of a single full-size memory chip.

SUMMARY OF THE INVENTION

It is a general object of the invention to provide a memory which utilizes partially defective memory components.

It is a more particular object of the invention to provide a computer memory which utilizes partially defective memory chips that are pin-for-pin compatible with each other, thereby allowing the partially defective memory chips to be stacked to form a memory component which is the pin and functional equivalent of a single full-size memory chip without any defective storage cells.

It is another object of the invention to provide a computer memory which utilizes partially defective memory components and which can be easily implemented on a memory card.

These and other objects are accomplished by the memory device of the present invention which comprises: a plurality of memory chips each having at least one defective storage cell such that the total number of functional, non-defective storage cells of the plurality of defective memory chips is equivalent to a single full-size memory chip having all functional storage cells and no defective storage cells; each of the memory chips having means for receiving an address signal indicating that a selected one of the storage cells of the memory chip is to be accessed; and control circuit means for enabling only a memory chip having a functional storage cell corresponding to the received address signal, and for disabling any memory chip having a defective storage cell corresponding to the received address signal.

The control circuit according to the invention can be implemented to control the chip driver circuit of a variety of different sizes of memory chips. For example, the control circuit can be implemented for controlling the chip driver circuit of a one-quarter size memory chip, a one-half size memory chip, a three-quarter size memory chip, or a full-size memory chip. A one-quarter size memory chip refers to a memory chip in which only one-quarter of its total number of storage cells is functional (i.e., three-quarters of the storage cells are defective). A one-half size memory chip refers to a memory chip in which half of its storage cells are functional and half of its storage cells are defective. A three-quarter size memory chip refers to a memory chip in which three-quarters of its total number of storage cells are functional, and the remaining one-quarter of storage cells is defective. A full-size memory chip refers to a chip in which all storage cells are functional.

In order for such "partially defective" memory chips to function as a full-size memory chip equivalent, it is necessary to "combine" chips in such a manner that the total number of functional storage cells of the combined chips is equal to the number of storage cells of a full-size memory chip. For example, two one-half size memory chips can be combined to provide a full-size chip equivalent since the total number of functional storage cells of the two one-half size memory chips is equal to the total number of functional storage cells of a single full-size memory chip. Similarly, a single one-quarter size memory chip and a single three-quarter size memory chip can be combined to provide a full-size memory chip equivalent.

BRIEF DESCRIPTION OF THE DRAWINGS

FIGS. 6(A) and 6(B) are logic tables for explaining the operation of FIG. 5.

PREFERRED EMBODIMENTS OF THE INVENTION

Figure 1:
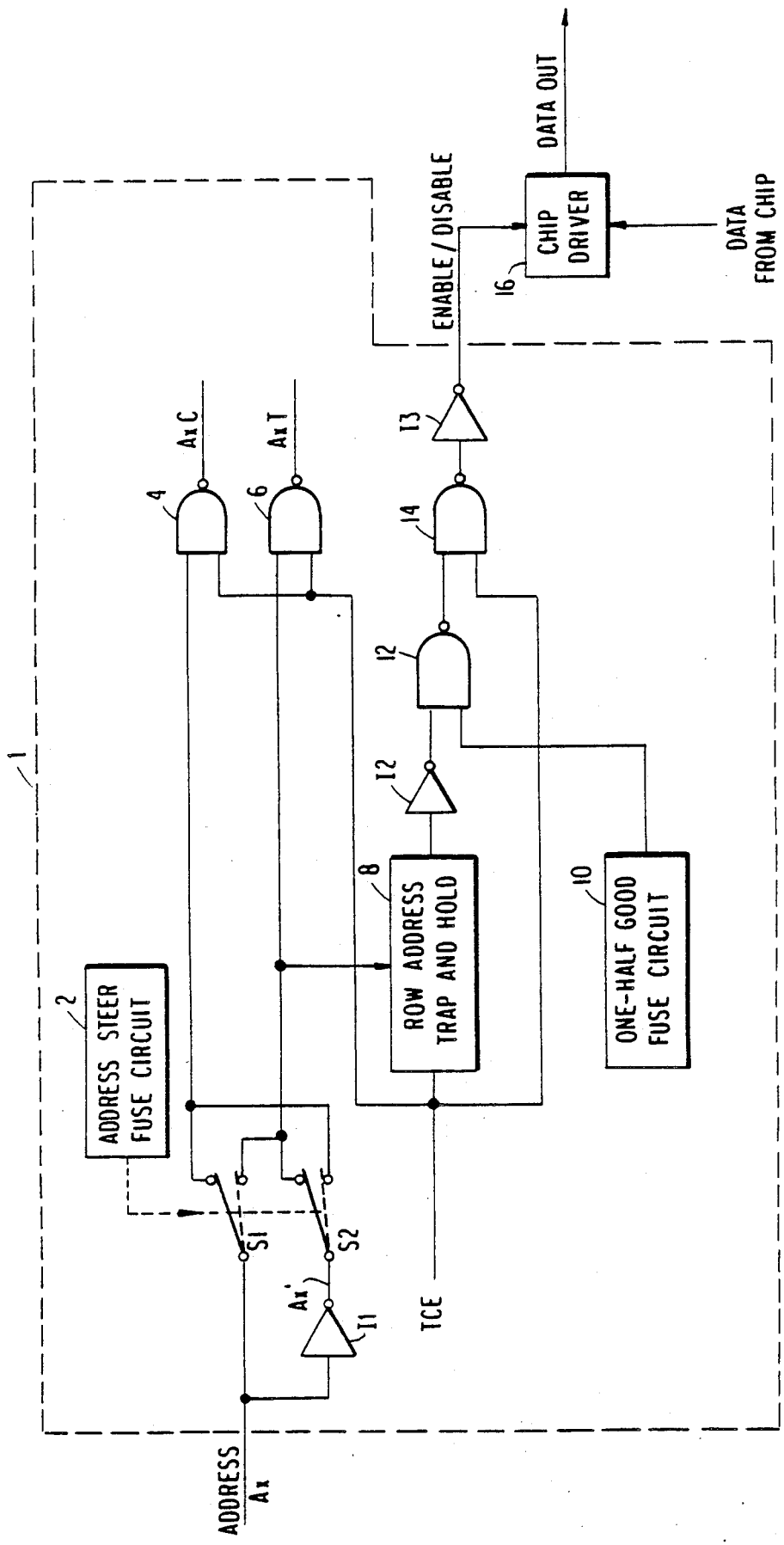
FIG. 1 is circuit diagram of a chip driver control circuit according to a first embodiment of the invention.

FIG. 1 shows a first embodiment of a novel chip driver control circuit of a memory device according to the invention.

The control circuit 1 controls the chip driver circuitry 16 of a one-half size or a full-size memory chip, and includes three inverters I1-I3, a pair of switches S1 and S2, an address steer fuse circuit 2, a one-half good fuse circuit 10, a row address trap and hold circuit 8, and four NAND gates 4, 6, 12 and 14. The output of control circuit 1 provides an enable/disable signal to a chip driver circuit 16. More specifically, a HIGH output signal from control circuit 1 enables driver circuit 16 to drive selected data out of a memory chip. As is known in the art, each memory chip has associated chip driver circuitry (often referred to as an "off-chip driver") for driving data, corresponding to a selected storage cell, out of the memory chip. A HIGH output signal from control circuit 1 enables chip driver 16, thereby allowing data to be driven out of the chip. A LOW output signal from control circuit 1 disables chip driver 16, thereby preventing data from being driven out of the memory chip. This operation will be described in more detail below.

The control circuit 1 receives both an address bit Ax of the chip address signal and also a pulse signal TCE. The address bit Ax corresponds to one designated bit of the total memory address signal. The leading edge of pulse signal TCE serves to synchronize the operations of row address trap and hold circuit 8 and NAND gates 4, 6 and 14.

The address steer fuse circuit 2 and one-half good fuse circuit 10 provide respective LOW output signals unless respective fuses in circuits 2 and 10 are "blown" during fabrication and testing of the memory chip. When these fuses are blown, circuits 2 and 10 provide HIGH output signals.

The address steer fuse circuit 2 serves to control the positions of switches S1 and S2. While in practice the switches would comprise FET devices having their gate electrodes coupled together to receive the output of circuit 2, in FIG. 1 they have been depicted as mechanical switches for ease of explanation. The switches S1 and S2 are coupled together such that both switches are switched to their respective up positions (shown by the solid lines of FIG. 1) or are both switched to their respective down positions (shown by the dotted lines of FIG. 1) at the same time. That is, one of the switches will not be switched to its up position while the other switch is switched to its down position. Accordingly, fuse circuit 2 serves to switch both switches S1 and S2 to their respective up or down positions depending on whether the fuse of circuit 2 has been blown during fabrication and testing of the memory chip.

The operation of the chip driver control circuit 1 will now be described.

Assume that the designated address bit Ax is LOW, and further that the switches S1 and S2 are switched to their respective up positions, as shown by the solid lines of FIG. 1.

The LOW signal (corresponding to address bit Ax) is supplied to a first input of NAND gate 4 via switch S1, and a HIGH signal is supplied to a first input of a NAND gate 6 via inverter I1 and switch S2. The other inputs of NAND gates 4 and 6 each receives a HIGH clock signal TCE. Since the first input of NAND gate 4 is LOW, gate 4 outputs a HIGH signal AxC corresponding to the complement of address bit Ax. Since both inputs of NAND gate 6 are HIGH, gate 6 outputs a LOW signal AxT representing the true value of address bit Ax. The NAND gates 4 and 6 constitute a True/Complement generator for address bit Ax. The True and Complement values of address bit Ax are supplied to an address control section of the chip (e.g., the chip's array decoder section) which receives the complete address signal before selecting a storage cell of the chip.

The row address trap and hold circuit 8 receives the HIGH signal from switch S2 as an input signal, and serves to output the HIGH input signal until the next leading edge of clock pulse TCE. Accordingly, the trap and hold circuit 8 can be implemented as a D-type latch circuit. The HIGH output from circuit 8 is inverted to a LOW signal by inverter I2, and the LOW signal from inverter I2 is supplied to a first input of NAND gate 12. For a one-half size memory chip, the fuse of fuse circuit 10 is blown so that circuit 10 supplies a HIGH signal to the other input of NAND gate 12. Since the first input of NAND gate 12 receives a LOW input signal, gate 12 outputs a HIGH signal to a first input of NAND gate 14. The other input of NAND gate 14 receives the HIGH clock signal TCE. Since both inputs of NAND gate 14 are HIGH, inverter I3 receives a LOW signal. The inverter I3 inverts the LOW signal from NAND gate 14 to output a HIGH enable signal to chip driver 16. The HIGH enable signal enables the chip driver 16 to drive data, corresponding to the total address signal (i.e., all bits of the address signal), out of the memory chip.

If the address bit Ax were HIGH, then the D-latch circuit 8 would receive and output a LOW signal, and NAND gates 4 and 6 would output LOW and HIGH signals, respectively. The outputs AxC and AxT of NAND gates 4 and 6 respectively correspond to the complement and true values for a HIGH value of Ax. The NAND gate 12 would then receive HIGH inputs from both inverter I2 and fuse circuit 10. Since in this case both inputs to NAND gate 12 are HIGH, gate 12 would output a LOW signal to the first input of NAND gate 14 which in turn outputs a HIGH signal to inverter I3. The inverter I3 then outputs a LOW disable signal to chip driver 16, thereby preventing data from being driven out of the memory chip.

Accordingly, with the arrangement shown in FIG. 1 in which switches S1 and S2 are switched to their respective up positions, control circuit 1 outputs a HIGH enable signal in response to a LOW address bit Ax, and outputs a LOW disable signal in response to a HIGH address bit Ax. The reverse is true when switches S1 and S2 are switched to their respective down positions. More specifically, if switches S1 and S2 are switched to their respective down positions (shown by the dotted lines of FIG. 1), then control circuit 1 outputs a HIGH enable signal to chip driver 16 upon receiving a HIGH value of Ax, and outputs a LOW disable signal to chip driver 16 upon receiving a LOW value of Ax.

Figures 2, 3, 4:
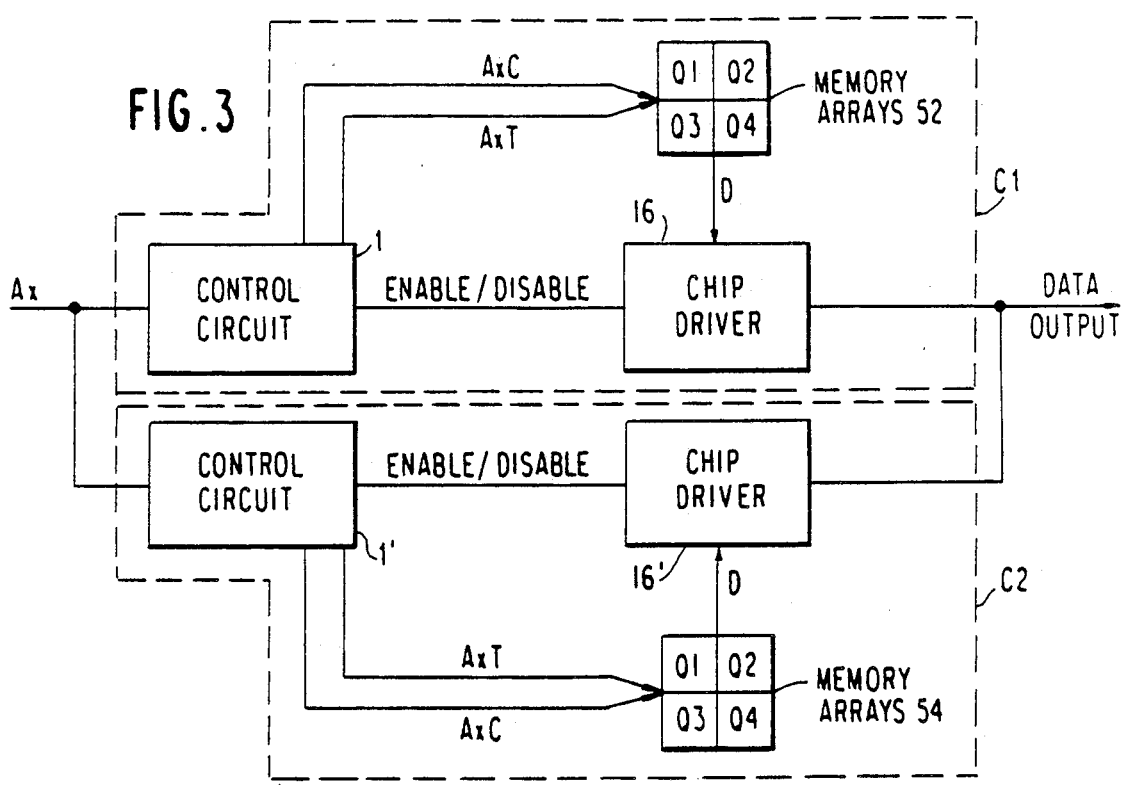
FIG. 2 is a logic table for explaining the operation of the control circuit of FIG. 1.
FIG. 3 is a general block diagram showing a one-half size memory implementation of the invention.
FIG. 4 is a logic table for explaining the operation of FIG. 3.

The input/output characteristics of control circuit 1 are summarized in the table of FIG. 2.

FIG. 3 shows a general block diagram of the invention in which two one-half good chips C1 and C2 are combined to form a single full-size chip equivalent. The partially defective chips C1 and C2 have respective chip driver circuits 16 and 16'. The outputs of control circuits 1 and 1' provide an enable/disable signal to chip drivers 16 and 16', respectively, in response to binary address Ax.

The Memory Arrays 52 and 54, each having four subarrays Q1–Q4 of memory cells of Chips C1 and C2 are assumed to be one-half good (i.e., two of the four subarrays of each chip are not operational), and have been pre-conditioned such that the memory cells that are addressed when AxT is low, are good. The defective memory cells reside in, or have been "reallocated" to, the address space associated to AxT being in a high state. This reallocation can be described as follows. Considering chip C1, assume subarrays Q1 and Q2 are bad, and subarrays Q3 and Q4 are good. The address decoding circuits of the chip will be set (by blowing fuses) such that address inputs for Q1 and Q2 will be steered to Q3 and Q4. That is, although Q1 and Q2 are bad, logical Q1 and Q2 addresses will still be valid (because they are steered to Q3 and Q4). The switches S1 and S2 of control circuit 1 are switched to their respective up positions, and switches S1 and S2 of control circuit 1' are switched to their respective down positions. Accordingly, referring to the table of FIG. 2, control circuit 1 provides an HIGH enable signal when Ax is LOW, and a LOW disable signal when Ax is HIGH. On the other hand, control circuit 1' provides a LOW disable signal in response to a LOW value of Ax, and a HIGH enable signal in response to a HIGH value of Ax.

The operation of FIG. 3 will now be explained for the example in which each of the one-half good chips C1 and C2 contains four storage cells, one in each subarray Q1–Q4. In order to access the four different storage cells in chips C1 and C2, a two-bit address signal is necessary. However, only two of the four storage cells in each of these are functional; the remaining two storage cells in each of the chips C1 and C2 are defective. The table in FIG. 4 shows the result of the internal relocation operation described previously. The good (functional) storage cells are located at contiguous high- or low-order address locations. More specifically, the logical lower-order addresses 00 and 01 of chip C1 are allocated to address the good (functional) storage cells in subarrays Q3 and Q4, and the higher-order addresses 10 are allocated to address C1 bad (defective) storage cells. On the other hand, the lower-order addresses of chip C2 are allocated to address bad storage cells, and the higher-order addresses of chip C2 are allocated to address good storage cells.

The bit address Ax, supplied to control circuits 1 and 1' (FIG. 3), corresponds to the highest order bit of the address signal in FIG. 4 (i.e., Ax=0 for addresses 00 and 01, and Ax=1 for addresses 10 and 11).

As shown in FIG. 3, control circuit 1 (having switches S1 and S2 switched to their respective up positions) will provide a HIGH enable signal to chip driver 16 when Ax is LOW (0), and control circuit 1' (having switches S1 and S2 switched to their respective down positions) will provide a LOW disable signal to chip driver 16' when Ax is LOW. Accordingly, for addresses (00) and (01) (i.e., Ax=0) chip driver 16 for chip C1 will be enabled, and chip driver 16' for chip C2 will be disabled. As shown in FIG. 4, chip C1 contains good (functional) storage cells at addresses (00) and (01), and chip C2 contains bad (defective) storage cells at addresses 00 and 01. Thus, for addresses (00) and (01), only data corresponding to good storage cells in chip C1 will be provided on the data output line. For addresses (10) and (11) (i.e., Ax=1), chip driver 16 for chip C1 will be disabled, and chip driver 16' for chip C2 will be enabled. As shown in FIG. 4, for addresses (10) and (11), only chip C2 contains good storage cells. Accordingly, for addresses (10) and (11), only data corresponding to good storage cells in chip C2 will be provided on the data output line. Thus, the arrangement shown in FIG. 3 allows for an address signal Ax to control the operation of chips C1 and C2.

FIG. 1 shows the chip driver control circuit 1 for a one-half size memory chip. However, the control circuit 1 can be utilized to control a driver circuit of a full-size memory chip. More specifically, when the fuse in one-half good fuse circuit 10 is not blown, circuit 10 will output a LOW signal. Since in this situation one input to NAND gate 12 is LOW, gate 12 outputs a HIGH signal to the first input of NAND gate 14. The other input of NAND gate 14 also receives a HIGH clock signal TCE. Since both inputs to NAND gate 14 are HIGH, gate 14 outputs a LOW signal to inverter I3 which provides a HIGH enable signal to chip driver 16. Accordingly, when the fuse of fuse circuit 10 is left unblown, control circuit 1 will output a HIGH enable signal to the associated chip driver circuit regardless of the address input signal. This function of circuit 10 corresponds to a full-size memory chip in which the chip driver is enabled for all address signals (i.e., since all storage cells in a full-size memory chip are functional).

Figure 5:
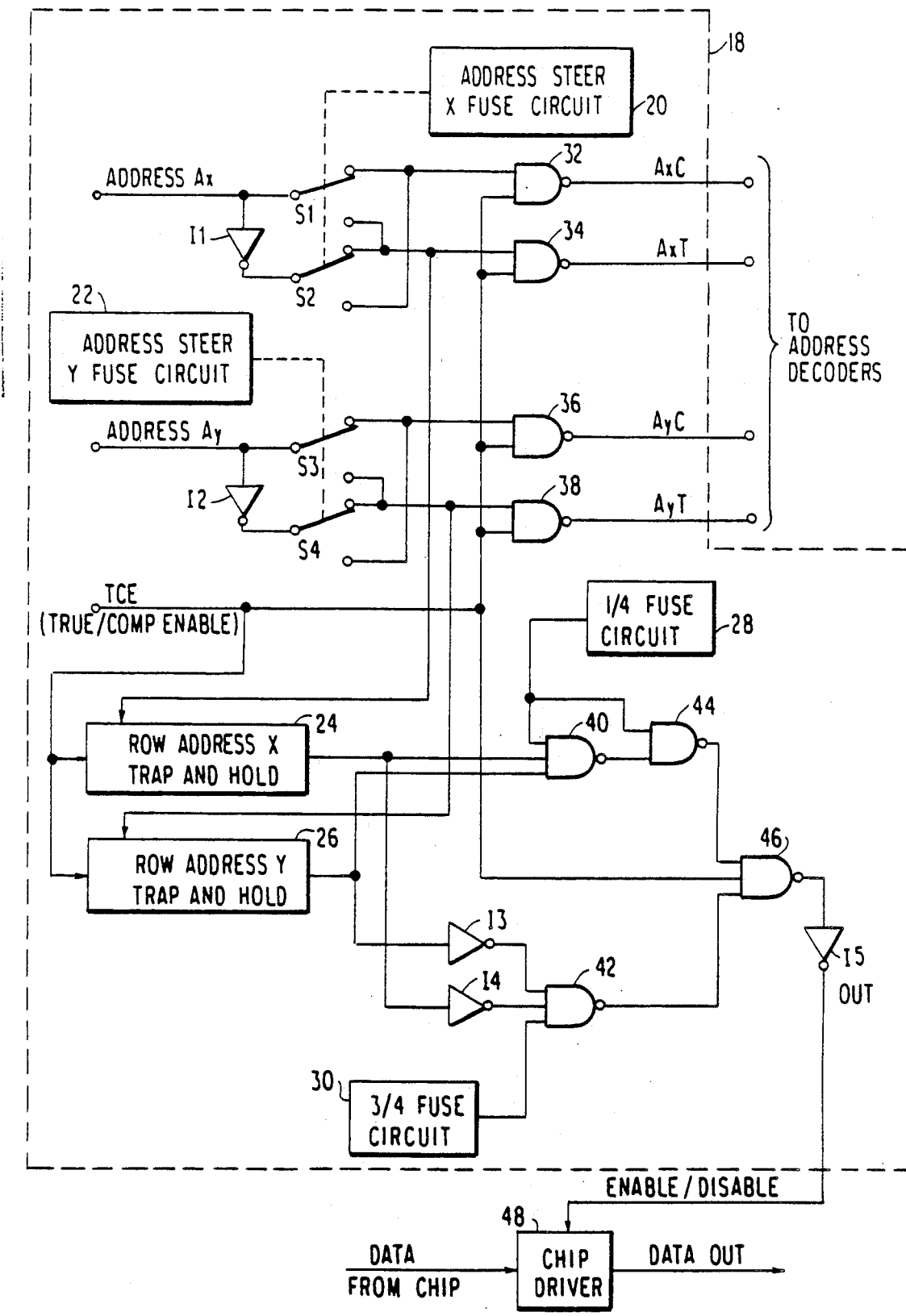
FIG. 5 is a circuit diagram according to a second embodiment of the invention.

FIG. 5 shows a control circuit 18 for controlling a chip driver circuit of a one-quarter good, a three-quarter good, or a full-size memory chip.

The control circuit 18 includes an address steer X fuse circuit 20, an address steer Y fuse circuit 22, five inverters I1–I5, two pairs of ganged switches S1, S2 and S3, S4, a row address X trap and hold circuit 24, a row address Y trap and hold circuit 26, a one-quarter fuse circuit 28, a three-quarter fuse circuit 30 and eight NAND gates 32, 34, 36, 38, 40, 42, 44 and 46.

The control circuit 18 according to this embodiment receives two bits Ax and Ay of the address signal, and a HIGH clock enable signal TCE which synchronizes the operations of trap and hold circuits 24 and 26, and NAND gates 32, 34, 36, 38 and 46. The output of control circuit 18 provides a HIGH enable/LOW disable signal to the chip driver circuit 48.

The switches S1 and S2 are controlled by the address steer X fuse circuit 20, and switches S3 and S4 are controlled by the address steer Y fuse circuit 22. The switches S1–S2 and S3–S4 are controlled in a manner similar to switches S1–S2 of FIG. 1. More specifically, switches S1–S2 are both switched to their respective up positions or are both switched to their respective down positions, depending on the output of X fuse circuit 20. Similarly, switches S3–S4 are both switched to their respective up positions, or are both switched to their respective down positions, depending on the output of Y fuse circuit 22.

The row address X trap and hold circuit 24 and the row address Y trap and hold circuit 26 can both be implemented as D-type latches. The NAND gates 32 and 34 constitute a true/complement generator for address bit Ax, and NAND gates 36 and 38 constitute a true/complement generator for address bit Ax. The one-quarter fuse circuit 28 and the three-quarter fuse circuit 30 are similar to the one-half fuse circuit of FIG. 1. More specifically, each of the fuse circuits 28 and 30 have fuses that can be blown during fabrication and testing of the chip. When the fuse is blown, circuits 28 and 30 each outputs a HIGH signal, otherwise circuits 28 and 30 output a LOW signal.

FIGS. 6(A) and 6(B) are tables showing the operation of circuit 18 for a one-quarter good memory chip and a three-quarter good memory chip, respectively.

As shown in the table of FIG. 6(A), when switches S1–S4 are switched to their respective up positions, control circuit 18 outputs a HIGH enable signal to chip driver 48 only when AxAy=00. On the other hand, referring to the table of FIG. 6(b), when switches S1–S4 are switched to their respective down positions, control circuit 18 outputs a HIGH enable signal when AxAy=01, 10 and 11, and outputs a LOW disable signal when AxAy=00.

An example will now be described for implementing a one-quarter good chip and a three-quarter good chip as an all good memory chip equivalent. In this example, it will be assumed that each of the one-quarter and the three-quarter good memory chips has four storage cells which are addressed by the two-bit address signal AxAy.

The one-quarter good memory chip contains only one functional storage cell; the remaining three storage cells are defective. The three-quarter good memory chip contains three functional storage cells and one defective storage cell. Accordingly, the total number of functional storage cells in the one-quarter and the three-quarter memory chips is equal to four, which corresponds to a single all good memory chip in which four storage cells are functional.

For this example, the control circuit 18, for the chip driver of the one-quarter good memory chip, has the characteristics shown in the table of FIG. 6(a), and the control circuit 18, for the chip driver of the three-quarter good memory chip drive circuit, has the characteristics shown in the table of FIG. 6(b).

Since in the table of FIG. 6(a) only address AxAy=00 provides a HIGH enable signal, translation logic circuitry is provided so that the single functional storage cell of the one-quarter good chip corresponds to address (00). Similarly, translation logic circuitry is provided so that the three functional storage cells of the three-quarter good chip correspond to addresses (01), (10) and (11) since the chip driver control circuit 18 will enable the three-quarter good chip driver in response to these addresses.

Thus, by implementing control circuit 18 according to the table of FIG. 6(a) for a one-quarter good memory chip, and control circuit 18 according to the table of FIG. 6(b) for a three-quarter good memory chip, data corresponding to a functional storage cell will be provided for each of the four address signals (i.e., data corresponding to the single functional storage cell of the one-quarter size memory chip will be enabled in response to address (00), and data corresponding to the three functional storage cells of the three-quarter size memory chip will be enabled in response to addresses (01), (10), and (11)).

The control circuit 18 of FIG. 5 can also be implemented to control a chip driver for an all-good memory chip. More specifically, this all-good memory chip implementation is accomplished by leaving the fuses of fuse circuits 28 and 30 unblown, so that these circuits output a LOW signal, thereby causing the outputs of NAND gates 42 and 44 to be HIGH. When the outputs of NAND gates 42 and 44 are HIGH (and the clock signal TCE is HIGH), NAND gate 46 outputs a LOW signal. The inverter I5 inverts the output of NAND gate 46 to a HIGH signal, thereby enabling chip driver 48. Thus, when the fuses of fuse circuits 28 and 30 are both unblown, control circuit 18 functions to provide a HIGH enable signal to chip driver 48 regardless of the address signal. This function of control circuit 18 corresponds to a full-size memory chip in which the chip driver is always enabled (i.e., since all storage cells are functional).

Figure 7:
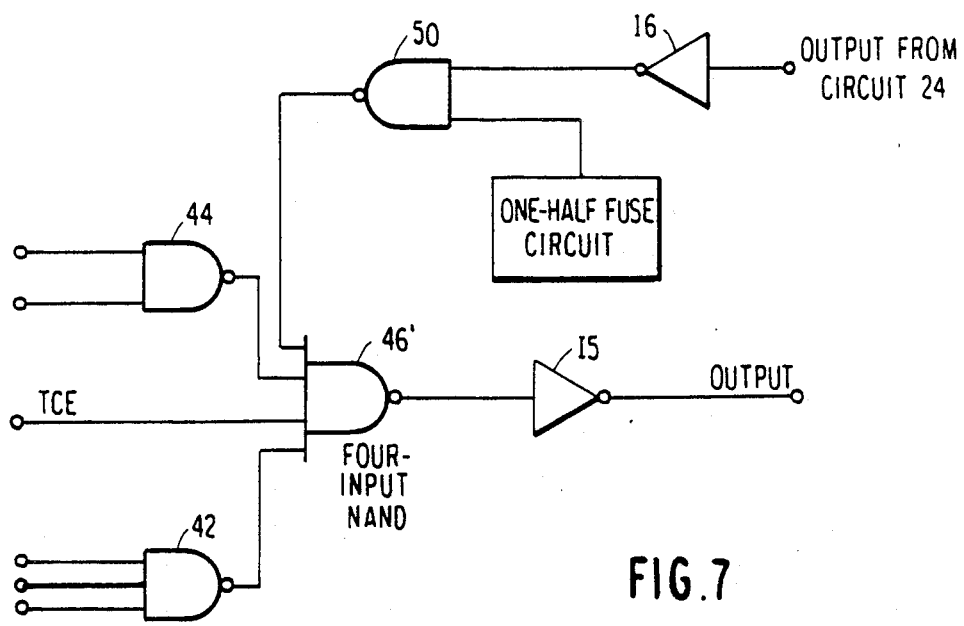
FIG. 7 is a partial circuit diagram showing a modification to the circuit of FIG. 5.

Further, the all-good memory chip implementation of control circuit 18 (i.e., in which fuse circuits 28 and 30 are left unblown) can be modified to control a chip driver for a one-half memory chip by providing a fourth input to NAND 46 of FIG. 5 and adding circuitry as shown in FIG. 7.

As shown in FIG. 7, three of the inputs of NAND gate 46' are the same as NAND gate 46 of the full-size memory chip implementation of FIG. 5. The fourth input of NAND gate 46' receives the output of NAND gate 50 which receives the output of inverter I6 and the output of one-half fuse circuit 10'. For a one-half good chip implementation, the fuse circuit 10' is blown so that it outputs a HIGH signal to NAND gate 50. The inverter I6 receives the output of row address X trap and hold circuit 24 shown in FIG. 5. Accordingly, when switches S1 and S2 are switched to their respective down positions and Ax 0, the output of NAND gate 50 is HIGH, thereby causing the output of NAND gate 46' to be LOW. The inverter I5 inverts the LOW output of NAND gate 46' to a HIGH enable signal for chip driver 48.

When switches S1 and S2 are switched to their respective up positions and Ax 1, the output of NAND gate 50 is HIGH, thereby causing the output of NAND gate 46' to be LOW. In this case, inverter I5 inverts the LOW output of NAND gate 46' to a HIGH enable signal for chip driver 48. By switching switches S1 and S2 to their respective down positions, inverter I5 outputs a HIGH enable signal when Ax=1, and outputs a LOW disable signal when Ax=0. Accordingly, the modification shown in FIG. 7, two driver control circuits to be implemented such that one of the control circuits enables a chip driver only when Ax=0, and the other control circuit enables a chip driver only when Ax=1. This modification corresponds to the one-half good implementation shown in FIG. 3.

For a full-size memory chip implementation of FIG. 7, the one-half good fuse circuit 10' is left unblown so that circuit 10' outputs a LOW signal, thereby causing the output of NAND gate 50 to go HIGH. Since in this case all inputs to NAND gate 46' are HIGH, a LOW input signal is supplied to inverter I5, thereby providing a HIGH enable signal. Thus, inverter I5 will output a HIGH enable signal regardless of the input address signal (which corresponds to an all-good memory chip implementation).

While the present invention has been described for a chip driver control circuit, the outputs of control circuit 1 (FIG. 1) and 18 (FIG. 5) can be used to power-on/power-off a memory chip in accordance with an input address signal, thereby conserving power. More specifically, rather than disabling a chip driver circuit, the power to the memory chip is disabled, thereby powering-off the memory chip.

Further, while the present invention has been particularly shown and described with reference to preferred embodiments thereof, it will be understood by those skilled in the art that the foregoing and other changes in form and details may be made without departing from the spirit and scope of the invention.

We claim:

1. A memory device comprising:
a plurality of memory chips each having a plurality of arrays of storage cells, a data output, and an address signal input for receiving an address signal corresponding to a selected one of the plurality of storage cells, at least one of the plurality of arrays of storage cells of each of the plurality of memory chips being non-functional, such that only one of the plurality of memory chips contains a functional storage cell which can be addressed by the address signal received on the address signal input; and
control means for receiving at least a portion of the address signal received on the address signal input, and for controlling, in response to said portion of the address signal, the plurality of memory chips such that only that one of the plurality of memory chips that has said functional storage cell corresponding to the address signal is enabled.

2. A memory device comprising:
a plurality of memory chips each having a plurality of arrays of storage cells, a data output, and an address signal input for receiving an address signal corresponding to a selected one of the plurality of storage cells, at least one of the plurality of arrays of storage cells of each of the plurality of memory chips being defective, such that only one of the plurality of memory chips contains a functional storage cell which corresponds to the address signal received on the address signal input, and each of the plurality of memory chips having associated driver means for driving data, corresponding to a selected one of the storage cells, to the chip data output; and
control means for receiving at least a portion of the address signal received on the address signal input, and for enabling, in response to said portion of the address signal, only that one of said driver means which is associated with that one of the plurality of memory chips that has said functional storage cell corresponding to said received address signal.

3. The memory device as claimed in claim 2, wherein said control means disables, in response to said portion of the address signal, all driver means associated with memory chips having non-functional storage cells corresponding to the received address signal.

4. The memory device as claimed in claim 2, wherein said control means comprises:
switching means for receiving the at least a portion of the address signal; and
control output means for supplying, in response to the at least a portion of the address signal, a driver means enable/disable signal;
said control output means supplying the driver means enable signal in response to a true value of the at least a portion of the address signal, and supplying a driver means disable signal in response to a complement value of said portion of the address signal.

5. The memory device as claimed in claim 4, wherein said control means further comprises switch control means for controlling said switching means such that said switching means is switched between a first position for supplying the true value of the at least a portion of the address signal to said control output means, and a second position for supplying the complement value of said portion of the address signal.

6. The memory device as claimed in claim 2, wherein said control means comprises a plurality of control circuits for respectively controlling the chip driver means associated with each of the plurality of memory chips.

7. The memory device as claimed in claim 6, wherein each of said plurality of control circuits includes means for indicating a total number of functional chip storage cells.

8. The memory device as claimed in claim 2, wherein said plurality of memory chips comprises a first memory chip and a second memory chip, and wherein said control means comprises a first control circuit for controlling the chip driver means associated with the first memory chip, and a second control circuit for controlling the chip driver means associated with the second memory chip.

9. The memory device as claimed in claim 8, wherein said first and second control circuits each receives at least a portion of the address signal, and wherein said first and second memory chips are signal pin-for-signal pin compatible with each other.

10. The memory device as claimed in claim 8, wherein only one-half of a total number of storage cells of said first and second memory chips is functional, and wherein addresses of the storage cells of said first and second memory chips are allocated such that all addresses which correspond to functional storage cells in said first memory chip correspond to non-functional storage cells in said second memory chip.

11. The memory device as claimed in claim 8, wherein said at least a portion of the address signal is one bit of the address signal received on the address signal input.

12. The memory device as claimed in claim 8, wherein only one-quarter of a total number of storage cells of said first memory chip is functional, and wherein only three-quarters of a total number of storage cells of said second memory chip are functional.

13. The memory device as claimed in claim 12, wherein said portion of the address signal is two bits of the address signal received on the address signal input.

14. The memory device as claimed in claim 12, wherein address locations which correspond to functional storage cells in said first memory chip, also correspond to non-functional storage cells in said second memory chip.

* * * * *